US012599029B2

(12) United States Patent
Hsieh et al.

(10) Patent No.: US 12,599,029 B2
(45) Date of Patent: Apr. 7, 2026

(54) PACKAGE STRUCTURE AND METHOD OF FORMING THE SAME

(71) Applicant: Taiwan Semiconductor Manufacturing Company, Ltd., Hsinchu (TW)

(72) Inventors: Chia-Han Hsieh, Miaoli County (TW); Yu-Jin Hu, Taoyuan City (TW); Hua-Wei Tseng, New Taipei City (TW); An-Jhih Su, Taoyuan City (TW); Der-Chyang Yeh, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 522 days.

(21) Appl. No.: 18/162,715

(22) Filed: Feb. 1, 2023

(65) Prior Publication Data

US 2024/0128143 A1 Apr. 18, 2024

Related U.S. Application Data

(60) Provisional application No. 63/415,667, filed on Oct. 13, 2022.

(51) Int. Cl.
| | |
|---|---|
| *H01L 21/78* | (2006.01) |
| *H01L 21/56* | (2006.01) |
| *H01L 23/00* | (2006.01) |
| *H01L 23/31* | (2006.01) |

(52) U.S. Cl.
CPC ........ *H01L 23/3192* (2013.01); *H01L 21/561* (2013.01); *H01L 21/78* (2013.01); *H01L 23/562* (2013.01)

(58) Field of Classification Search
None
See application file for complete search history.

(56) References Cited

U.S. PATENT DOCUMENTS

| | | | |
|---|---|---|---|
| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |

(Continued)

*Primary Examiner* — Jay C Chang
(74) *Attorney, Agent, or Firm* — JCIPRNET

(57) ABSTRACT

Provided are a package structure and a method of forming the same. The method includes: forming an interconnect structure on a substrate; performing a laser grooving process to form a first opening in the interconnect structure and form a debris layer on a sidewall of the first opening in a same step; forming a protective layer to fill in the first opening and cover the debris layer and the interconnect structure; patterning the protective layer to form a second opening, wherein the second opening is spaced from the debris layer by the protective layer; performing a planarization process on the protective layer to expose a topmost contact pad of the interconnect structure; and performing a mechanical dicing process through the second opening to form a third opening in the substrate and cut the substrate into a plurality of semiconductor dies.

20 Claims, 9 Drawing Sheets

(56) References Cited

U.S. PATENT DOCUMENTS

| 9,372,206 | B2 | | 6/2016 | Wu et al. |
| 9,496,189 | B2 | | 11/2016 | Yu et al. |
| 2020/0312715 | A1 | * | 10/2020 | Choi ................. H01L 21/76838 |
| 2022/0375840 | A1 | * | 11/2022 | Ory ......................... H01L 24/03 |

* cited by examiner

PACKAGE STRUCTURE AND METHOD OF FORMING THE SAME

CROSS-REFERENCE TO RELATED APPLICATION

This application claims the priority benefit of U.S. provisional application Ser. No. 63/415,667, filed on Oct. 13, 2022. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are manufactured on a single semiconductor wafer. The individual dies are typically singulated by sawing the integrated circuits along a scribe line. The individual dies are then packaged separately, in multi-die modules, or in other types of packaging, for example.

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on. With the shrink in the size of the packages, the challenges of fabricating the packages become more difficult.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
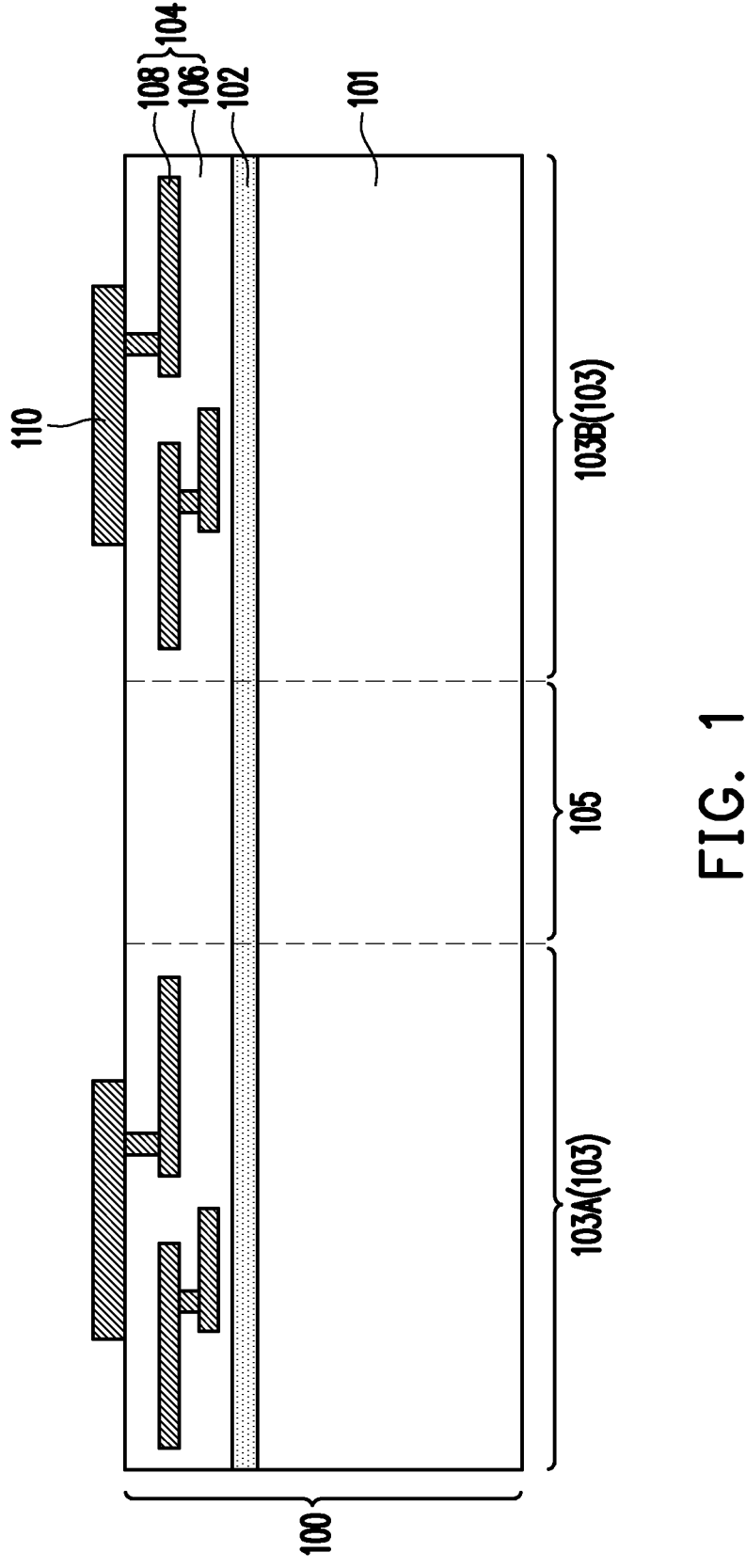
FIG. 1 to FIG. 7 are cross-sectional views of a method of forming a die structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 7 are cross-sectional views of a method of forming a die structure in accordance with some embodiments.

Referring to FIG. 1, a semiconductor wafer 100 with a first semiconductor device die 103A and a second semiconductor device die 103B formed therein is provided. In some embodiments, the semiconductor wafer 100 includes a semiconductor substrate 101, a device layer 102, and an interconnect structure 104. Specifically, the semiconductor substrate 101 may include a plurality of die regions 103 and a scribe line region 105. The scribe line region 105 may surround the die regions 103 and may be disposed between the die regions 103. In some embodiments, the die regions 103 include a wide variety of functional structures, such as the first semiconductor device die 103A and the second semiconductor device die 103B. On the other hands, the scribe line region 105 is formed by not placing functional structures (such as active devices) into the area intended for the scribe line region 105. Other structures, such as test pads or dummy metals used for planarization, could be placed into the scribe line region 105, but would not be necessary for the functioning of the first semiconductor device die 103A and the second semiconductor device die 103B once the first semiconductor device die 103A and the second semiconductor device die 103B have been separated from each other. In the top view, the scribe line region 105 may include a plurality of first scribe streets extending along a X direction and a plurality of second scribe streets extending along a Y direction, where the first scribe streets meet the second scribe streets at a plurality of cross-road sections.

The cross-road sections may be located at four corners of each device die. In some embodiments, the scribe line region 105 may have a width of between about 10 μm and about 200 μm, such as about 65 μm.

In some embodiments, the semiconductor substrate 101 may include silicon or other semiconductor materials. Alternatively, or additionally, the semiconductor substrate 101 may include other elementary semiconductor materials such as germanium. In some embodiments, the semiconductor substrate 101 is made of a compound semiconductor such as silicon carbide, gallium arsenic, indium arsenide or indium phosphide. In some embodiments, the semiconductor substrate 101 is made of an alloy semiconductor such as silicon germanium, silicon germanium carbide, gallium arsenic phosphide, or gallium indium phosphide. In some embodiments, the semiconductor substrate 101 includes an epitaxial layer. For example, the semiconductor substrate 101 has an epitaxial layer overlying a bulk semiconductor.

In some embodiments, a device layer 102 is formed on the semiconductor substrate 101 in a front-end-of-line (FEOL) process. The device layer 102 includes a wide variety of devices. In some embodiments, the devices comprise active components, passive components, or a combination thereof. In some embodiments, the devices may include integrated circuits devices. The devices are, for example, transistors, capacitors, resistors, diodes, photodiodes, fuse devices, or other similar devices. In some embodiments, the device layer 102 includes a gate structure, source/drain regions, and isolation structures, such as shallow trench isolation (STI) structures (not shown). The device layer 102 shown in FIG. 1 are merely examples, and other structures may be formed in the device layer 102. In the device layer 102, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed on the semiconductor substrate 101. The functions of the devices may include memory, processors, sensors, amplifiers, power distribution, input/output circuitry, or the like.

After forming the device layer 102, an interconnect structure 104 is formed over the semiconductor substrate 101. In detail, the interconnect structure 104 includes a dielectric layer 106 and a plurality of metal features 108. The metal features 108 are formed in the dielectric layer 106 and electrically connected with each other. In some embodiments, the dielectric layer 106 includes an inner-layer dielectric (ILD) layer on the semiconductor substrate 101, and at least one inter-metal dielectric (IMD) layer over the inner-layer dielectric layer. In some embodiments, the dielectric layer 106 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the dielectric layer 106 includes low-k dielectric materials that have a dielectric constant less than 4. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. In the present embodiment, the dielectric layer 106 includes extremely low-k (ELK) dielectric materials that have a dielectric constant less than 2.5, such as porous carbon doped silicon dioxide. In alternative embodiments, the dielectric layer 106 include one or more dielectric materials. In some embodiments, the dielectric layer 106 is formed by any suitable method, such as chemical vapor deposition (CVD), spin-on, or the like. Although the dielectric layer 106 illustrated in FIG. 1 is a single-layered structure, the embodiments of the present disclosure are not limited thereto. In other embodiments, the dielectric layer 106 may be a bi-layered structure or multi-layered structure.

In some embodiments, the metal features 108 include plugs and metal lines. The plugs may include contacts formed in the inner-layer dielectric layer, and vias formed in the inter-metal dielectric layer. The contacts are formed between and in connect with the device layer 102 and a bottom metal line. The vias are formed between and in connect with two metal lines. The metal features 108 may be made of tungsten (W), copper (Cu), copper alloys, aluminum (Al), aluminum alloys, or a combination thereof. In some alternatively embodiments, a barrier layer (not shown) may be formed between the metal features 108 and the dielectric layer 106 to prevent the material of the metal features 108 from migrating to the device layer 102. A material of the barrier layer includes tantalum, tantalum nitride, titanium, titanium nitride, cobalt-tungsten (CoW) or a combination thereof, for example.

As shown in FIG. 1, a plurality of contact pads 110 may be formed over and in electrical contact with the metal features 108 in order to provide external connections for the first semiconductor device die 103A and the second semiconductor device die 103B. The contact pads 110 may be formed of a conductive material such as aluminum, although other suitable materials, such as copper, tungsten, or the like, may alternatively be utilized. The contact pads 110 may be formed using a process such as PVD and CVD, although other suitable materials and methods may alternatively be utilized. Once the material for the contact pads 110 has been deposited, the material may be shaped into the contact pads 110 using, e.g., a photolithographic masking and etching process. In some embodiments, the contact pads 110 may be formed with the topmost plug of the metal features 108 simultaneously. In this case, the contact pads 110 may be regarded as a portion of the metal features 108. In exemplary embodiments, the contact pads 110 include one or more input/output (I/O) pads, bump pads or bond pads, for example.

In some alternative embodiments, a plurality of test pads (not shown) are located on the interconnect structure 104 of the scribe line region 105. The test pads may be in electrical connected with the underlying test device or test circuit in the device layer 102 through the interconnect structure 104. In some embodiments, the test pads include wafer acceptance testing (WAT) pads and/or optical critical dimension (OCD) pads. During wafer testing, the test pads located on the said scribe streets are electrically coupled to an external terminal through probe needles for testing. The test pads are selected to test different properties of the wafer, such as leakage current, breakdown voltage, threshold voltage and effective channel length, saturation current, gate oxide thickness, critical dimension, contact resistance and connections.

Figure 2:
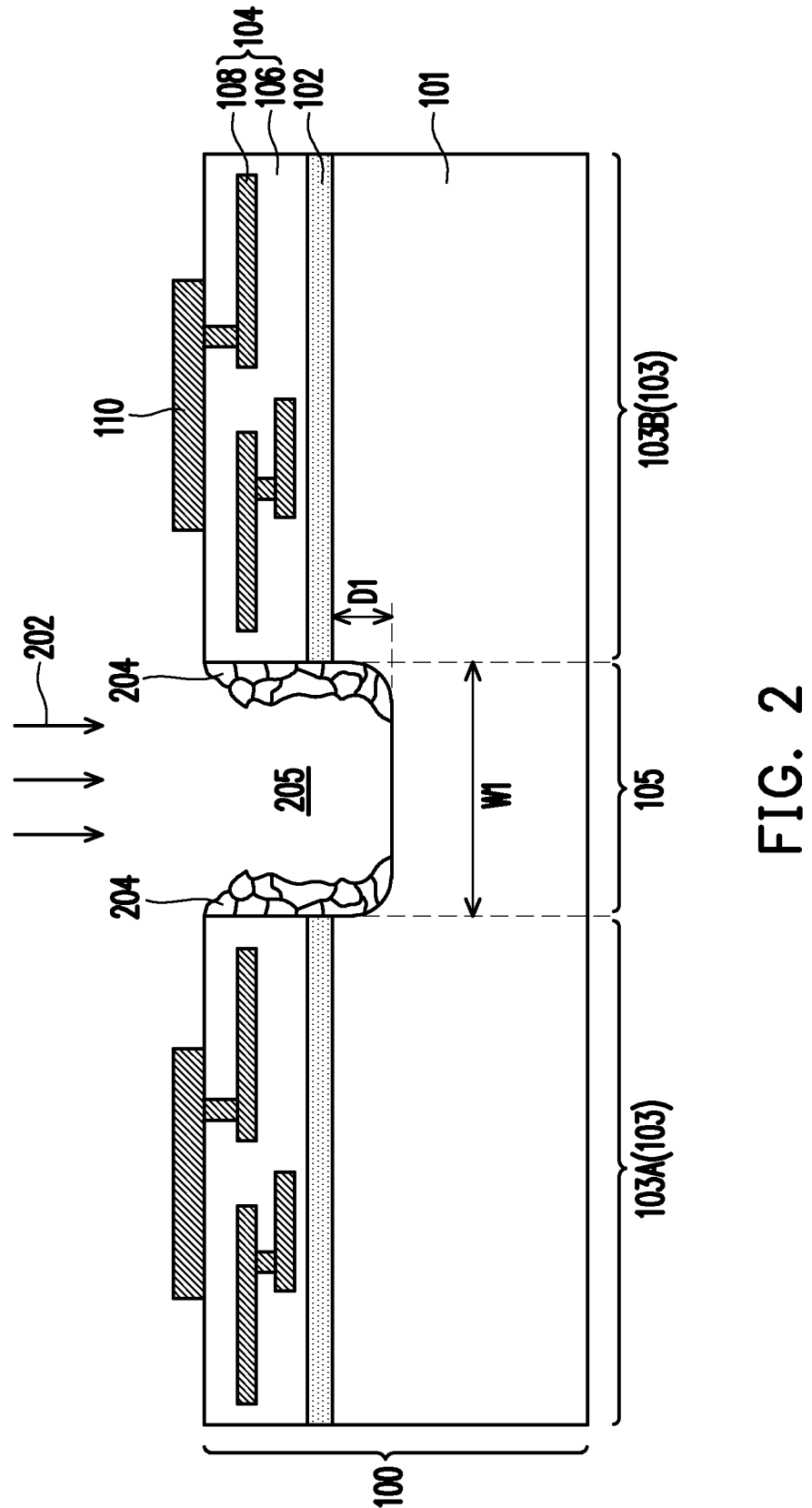

Referring to FIG. 2, a laser grooving process 202 is performed on the semiconductor wafer 100 to form a first opening 205. In detail, a laser beam is applied to the semiconductor wafer 100 to form the first opening 205 with a predetermined depth in the regions of the scribe streets within the scribe line region 105 without cutting through the semiconductor wafer 100. In some embodiments, the first opening 205 penetrates through the interconnect structure 104, the device layer 102, and partially into the semiconductor substrate 101. The first opening 205 may have a width W1 of between about 50 μm and about 60 μm, such as about 55 μm. The width W1 of the first opening 205 may less than or equal to the width of the scribe line region 105. In addition, the first opening 205 may extend into the semiconductor substrate 101 to a depth D1 which is measured from the top surface of the semiconductor substrate 101 to the bottom surface of the first opening 205. The depth D1 may be greater than 3 μm, such as about 5 μm. In some embodiments, the laser beam is a UV solid-state laser having a wavelength of about 355 nm, an yttrium-aluminum-garnet (YAG) laser, a neodymium-YAG laser, or other appropriate lasers. For example, the laser grooving process 202 is performed with an UV laser such as the neodymium-YAG laser with a laser power about 1.6 W each pass.

It should be noted that the laser grooving process 202 generally results in severe recast and debris due to the laser interaction with the interconnect structure 104, the device layer 102, and the semiconductor substrate 101. Specifically, the laser grooving process 202 is performed to remove portions of the interconnect structure 104, the device layer 102, and the semiconductor substrate 101, so that a recast layer or a debris layer 204 may be formed on a sidewall of the first opening 205 in a same step. That is, the first opening 205 and the debris layer 204 are formed simultaneously. In this case, a material of the debris layer 204 may be derived or formed from the interconnect structure 104, the device layer 102, and the semiconductor substrate 101. For example, the debris layer 204 may include metal (such as Cu), extremely low-k dielectric material, silicon, a combination thereof, or the like. In addition, the top surface of the semiconductor substrate 101 in the die region 103 is higher than the top surface of the semiconductor substrate 101 in the scribe line region 105, so that a portion of the sidewall of the semiconductor substrate 101 is exposed. Therefore, the debris layer 204 may be formed on the semiconductor substrate 101 in the scribe line region 105, and further extends to cover the portion of the sidewall of the semiconductor substrate 101, the sidewall of the device layer 102, and the sidewall of the interconnect structure 104.

Further, as shown in FIG. 2, the debris layer 204 containing undesirable crystal imperfections and large grain boundary may cause the stress due to cracking, which results in the delamination issue of the dielectric layer 106 (especially extremely low-k dielectric material) of the interconnect structure 104 in the following reliability testing, thereby decreasing the yield. In addition, the debris layer 204 having the metal material may induce the internal stress due to the high thermal expansion coefficient, thereby resulting in the damages, such as peeling, delamination, or dielectric fracture. Accordingly, in the traditional laser grooving process, a step of cleaning grooves scribed by a laser scriber with an etchant comprising a base and peroxide mixture, an acid and peroxide mixture, a NaOH solution, or several other solutions known and used in the art to remove debris from the grooves and the top surface of the wafer is required. However, this etching step must be done carefully to avoid removal of all the top surface oxide. Further, it is difficult to entirely remove the accumulated debris by the standard cleaning methods. In order to solve the said delamination issue, in the present embodiment, the original passivation layer is used as a stress buffer layer to wrap the debris layer 204. In this case, the stress caused by the molding swelling due to moisture absorption would be absorbed or relieved by the stress buffer layer and would not be transmitted to the interconnect structure 104 through the debris layer 204. That is, the delamination of the dielectric layer 106 of the interconnect structure 104 can be greatly reduced. The formation steps of the stress buffer layer will be detailed in the following paragraphs.

Figure 3:
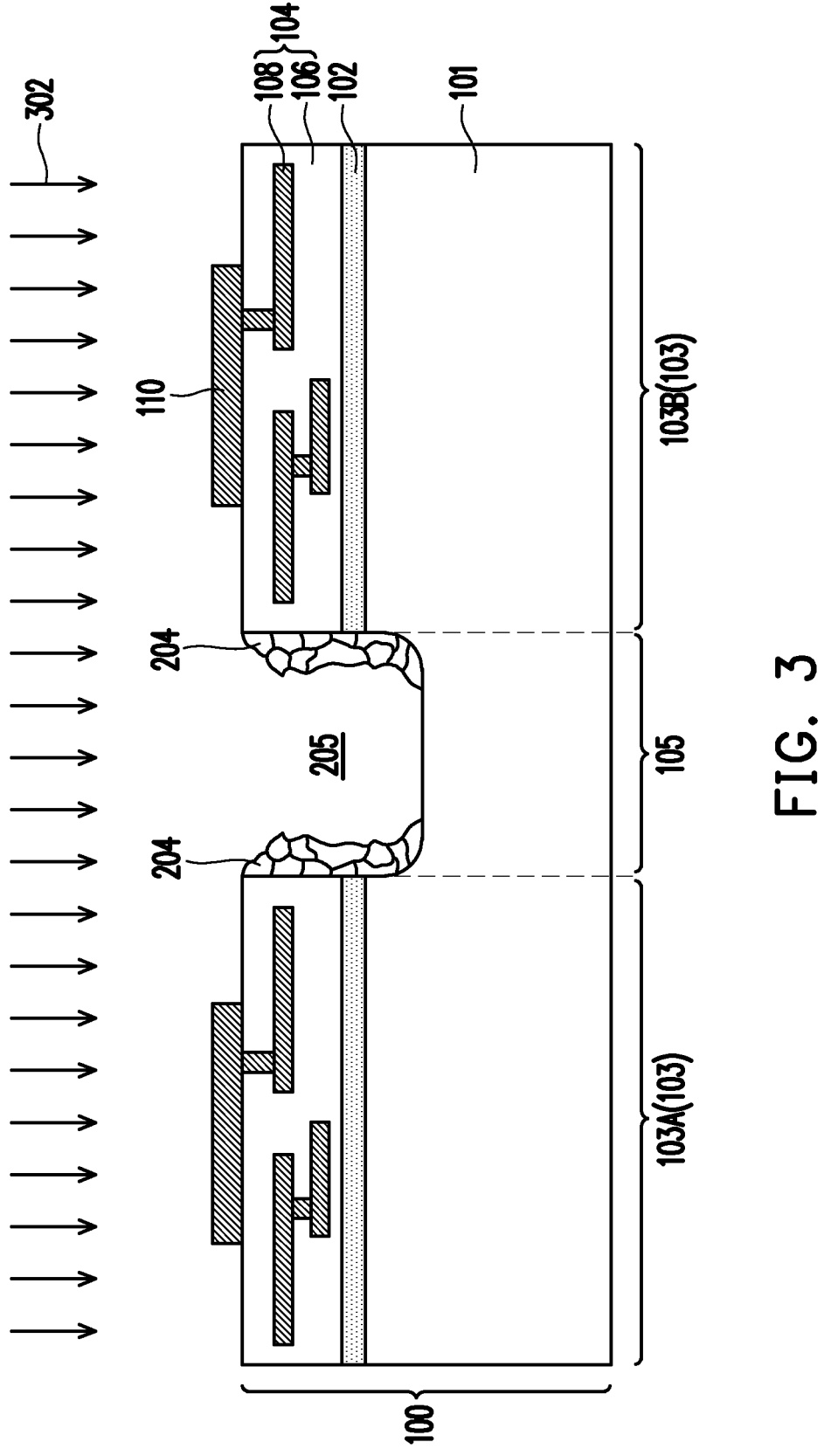
Figure 4:
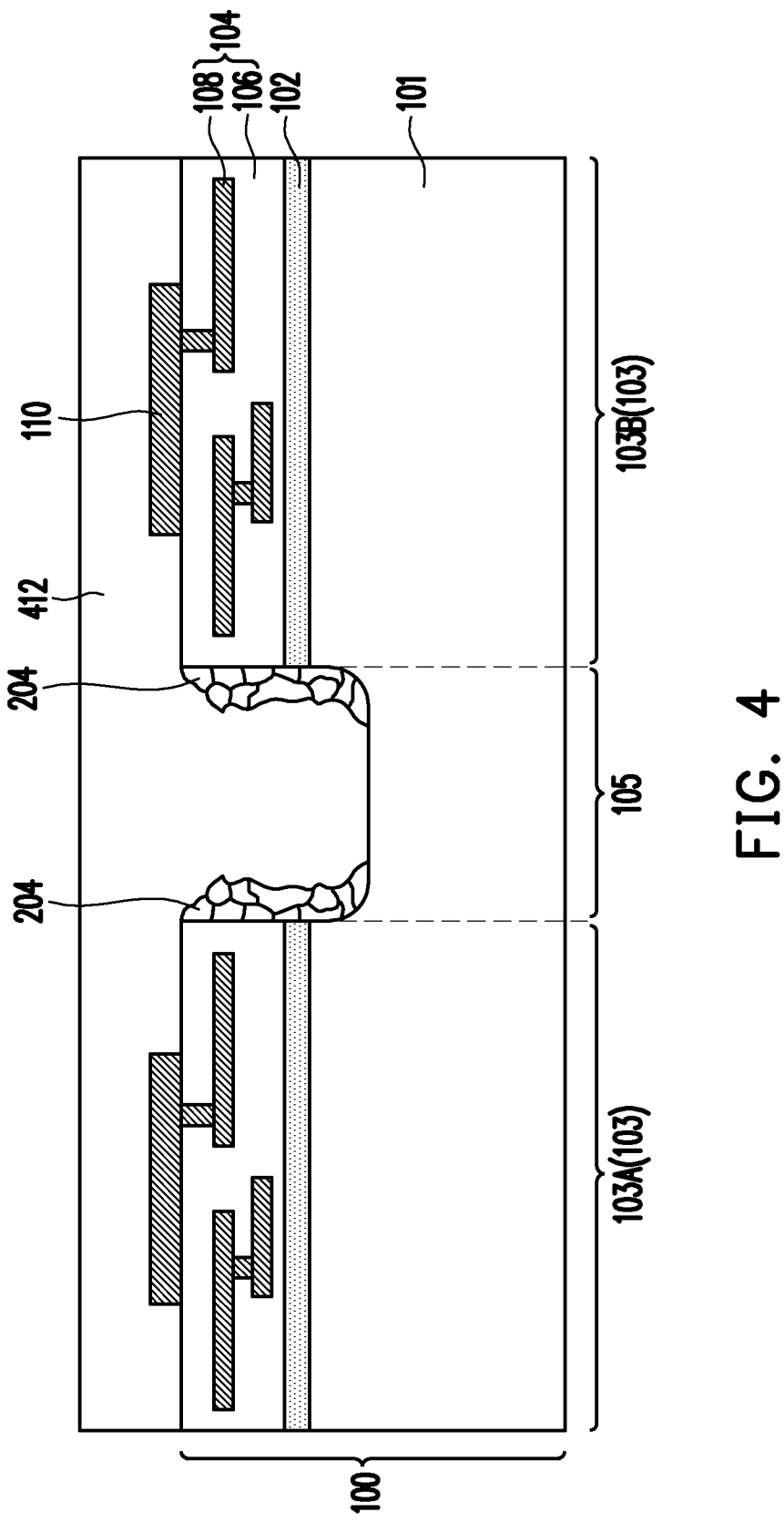

Referring to FIG. 3, a surface treatment 302 may be performed on the structure illustrated in FIG. 2 to activate the surfaces, thereby increasing an adhesion between the interconnect structure 104 and the subsequently formed stress buffer layer 412 (FIG. 4). In some embodiments, the surface treatment 302 includes a plasma treatment. The plasma treatment may be performed in a vacuum environment (e.g., a vacuum chamber, not shown). The process gas used for generating the plasma may be an oxygen-containing gas, which includes a first gas including oxygen ($O_2$) and argon (Ar), a second gas including $O_2$ and nitrogen ($N_2$), or a third gas including $O_2$ and helium (He). The plasma treatment may also be performed using pure or substantially pure $O_2$, Ar, or $N_2$ as the process gas. In some embodiments, the structure illustrated in FIG. 3 may be cleaned after the surface treatment 302. The cleaning may include performing e.g., a chemical cleaning and a de-ionized water cleaning/rinse.

Referring to FIG. 4, a stress buffer layer 412 is formed on the interconnect structure 104. Specifically, the stress buffer layer 412 may be formed to fill in the first opening 205 and cover the debris layer 204 and the interconnect structure 104. In some embodiments, the stress buffer layer 412 includes a polymer material, such as polyimide, polybenzoxazole (PBO), benzocyclobutene (BCB), the like, or a combination thereof and is formed by a suitable process spin coating, laminating, or the like. Although the stress buffer layer 412 illustrated in FIG. 4 is a single-layered structure, the disclosure is not limited thereto. In other embodiments, the stress buffer layer 412 may be a bi-layered structure or multi-layered structure formed of the polymer material. The stress buffer layer 412 and the dielectric layer 106 may have different materials with different physical properties. For example, the stress buffer layer 412 is a polyimide layer and the dielectric layer 106 is a silicon oxide layer. The stress buffer layer 412 may have a Young's modulus less than a Young's modulus of the dielectric layer 106, which means the stress buffer layer 412 is softer or more elastic than the dielectric layer 106. Similarly, the stress buffer layer 412 is softer or more elastic than the debris layer 204 retested from the interconnect structure 104. In some embodiments, the Young's modulus of the stress buffer layer 412 is between about 2 GPa and about 4 GPa, and more specifically, between about 2.5 GPa and about 3.5 GPa, such as about 3 GPa. Additionally, the stress buffer layer 412 may have a tensile strength between 90 MPa and about 200 MPa, and more specifically, between about 170 MPa and about 190 MPa, such as about 185 MPa. Further, the stress buffer layer 412 may have an elongation between about 50% and about 100%, and more specifically, between about 70% and about 90%, such as about 85%, before rupture.

Figure 5:
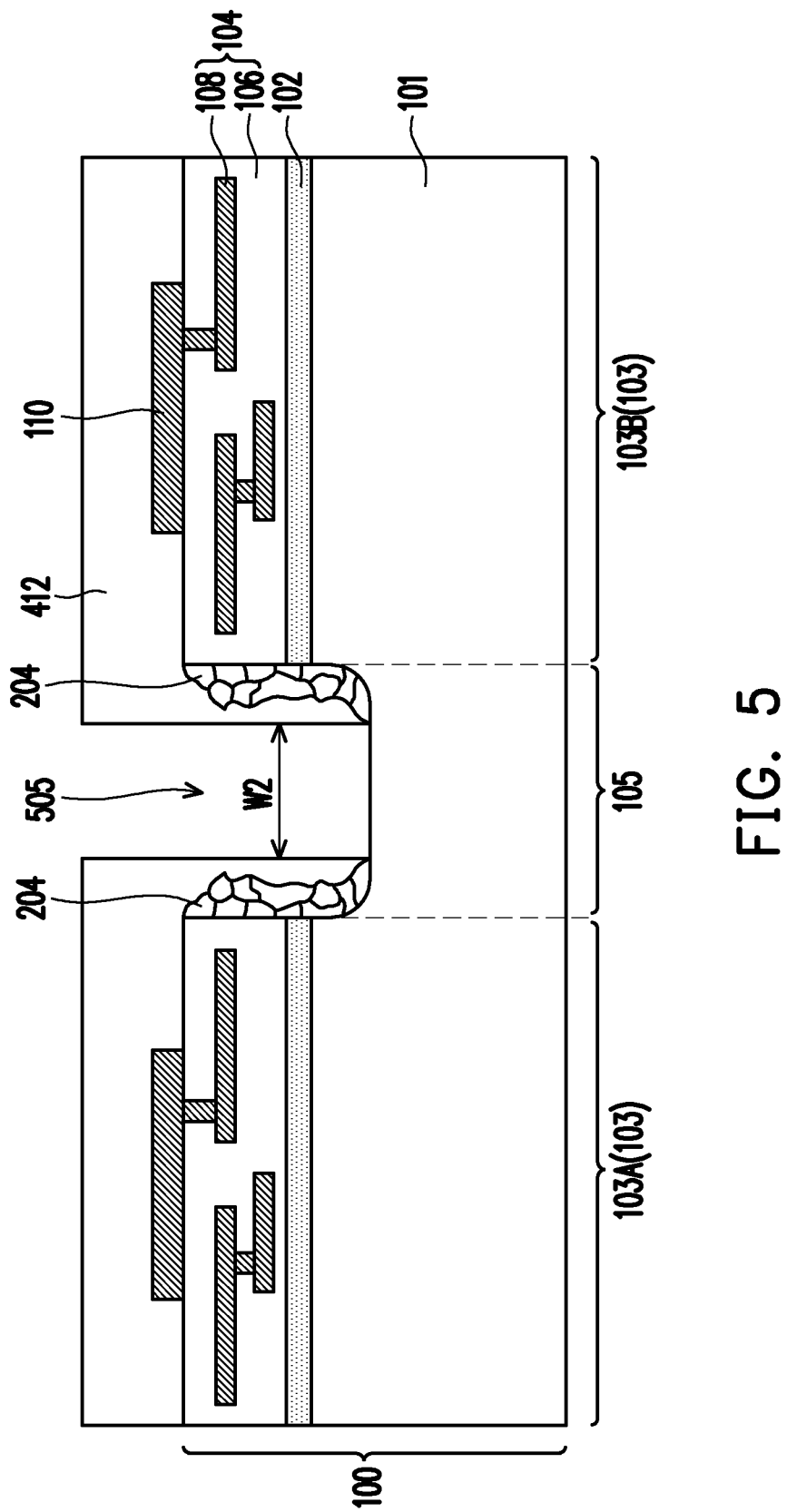

Referring to FIG. 5, the stress buffer layer 412 is patterned to form a second opening 505 in the stress buffer layer 412 within the first opening 205. In some embodiments, when the stress buffer layer 412 is the photosensitive polymer material, the patterning method may include a lithographic process (which includes exposure and development processes) by using a mask which covers the die regions 103 and exposes the scribe line region 105. In some alternative embodiments, the patterning method may include a laser ablation process to directly remove a portion of the stress buffer layer 412 within the scribe line region 105. The laser beam used in the laser ablation process may include a UV laser having a wavelength of about 355 nm, or other appropriate lasers. However, the embodiments of the present invention are not limited thereto, any patterning method that may remove the stress buffer layer 412 is within the scope of the disclosure. After patterning the stress buffer layer 412, the second opening 505 may penetrate through the stress buffer layer 412 and expose the semiconductor substrate 101. In some embodiments, the second opening 505 may have a width W2 of between about 35 μm and about 45 μm, such as about 40 μm. The width W1 of the first opening 205 may greater than the width W2 of the second opening 505. In this case, the second opening 505 may be spaced from the debris layer 204 by the stress buffer layer 412. That is, the debris layer 204 is completely wrapped by the stress buffer layer 412 and not exposed by the second opening 505. Herein, the stress buffer layer 412 may be referred to as a protective layer to protect the debris layer 204 from exposing by the second opening 505.

Figure 6:
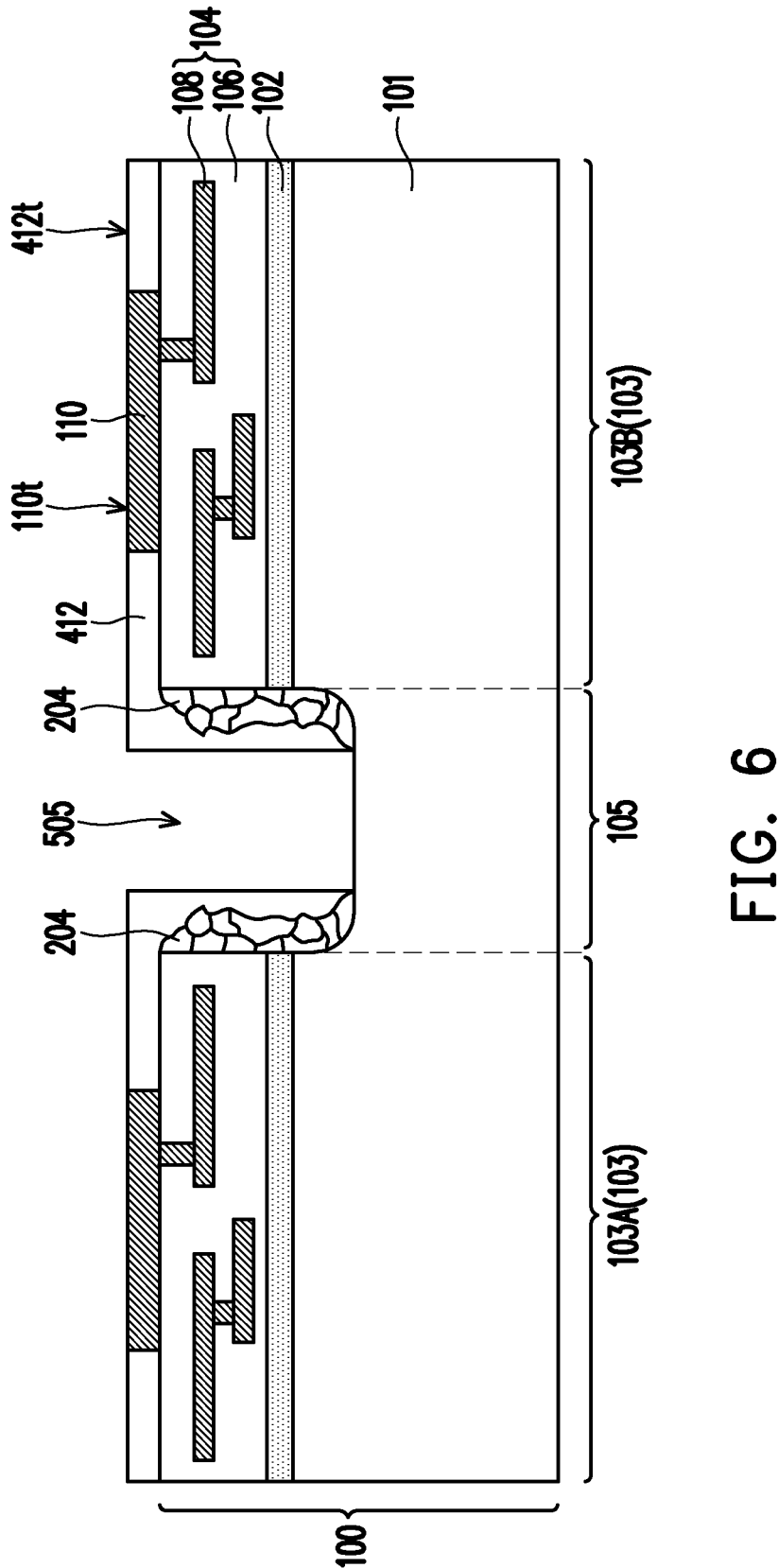

Referring to FIG. 6, a planarization process is performed to remove a portion of the stress buffer layer 412 until exposing the top surfaces 110t of the contact pads 110. In some embodiments, the planarization process may include a chemical-mechanical polishing (CMP) process, a mechanical grinding process, or any suitable removal process. After performing the planarization process, the top surface 412t of the stress buffer layer 412 may be level with the top surfaces 110t of the contact pads 110.

Figure 7:
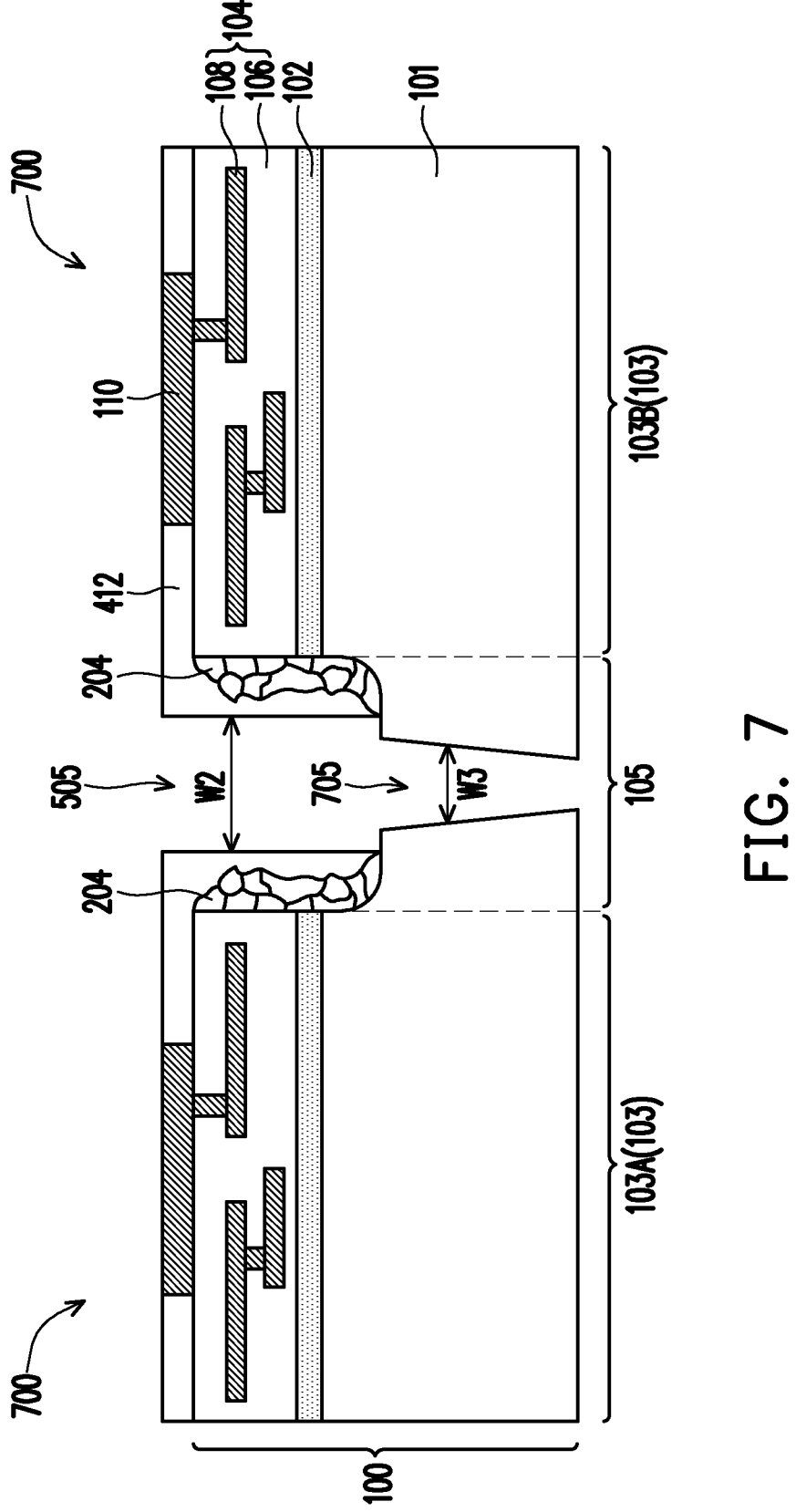

Referring to FIG. 7, a mechanical dicing process is performed through the second opening 505 to form a third opening 705 in the semiconductor substrate 101. In some embodiments, the mechanical dicing process includes a mechanical blade dicing step using a diamond embedded blade (not shown) to cut through the semiconductor wafer 100 along the scribe line region 105 to separate the first semiconductor device die 103A from the second semiconductor device die 103B (i.e., singulating the dies). Specifically, the third opening 705 may extends from a bottom surface of the second opening 505 to a bottom surface of the semiconductor substrate 101, and the second opening 505 is in spatial communication with the third opening 705. In this case, the semiconductor wafer 100 is cut by the second opening 505 and the third opening 705 to form the first semiconductor device die 103A and the second semiconductor device die 103B separated from each other. In some embodiments, the third opening 705 may have a width W3 of between about 27.5 μm and about 32.5 μm, such as about 30 μm. The width W2 of the second opening 505 may greater than the width W3 of the third opening 705. As shown in FIG. 7, after performing the mechanical dicing process, the semiconductor wafer 100 are separate and singulated into a plurality of singulated structures 700, hereinafter called die structures 700.

Figure 8:
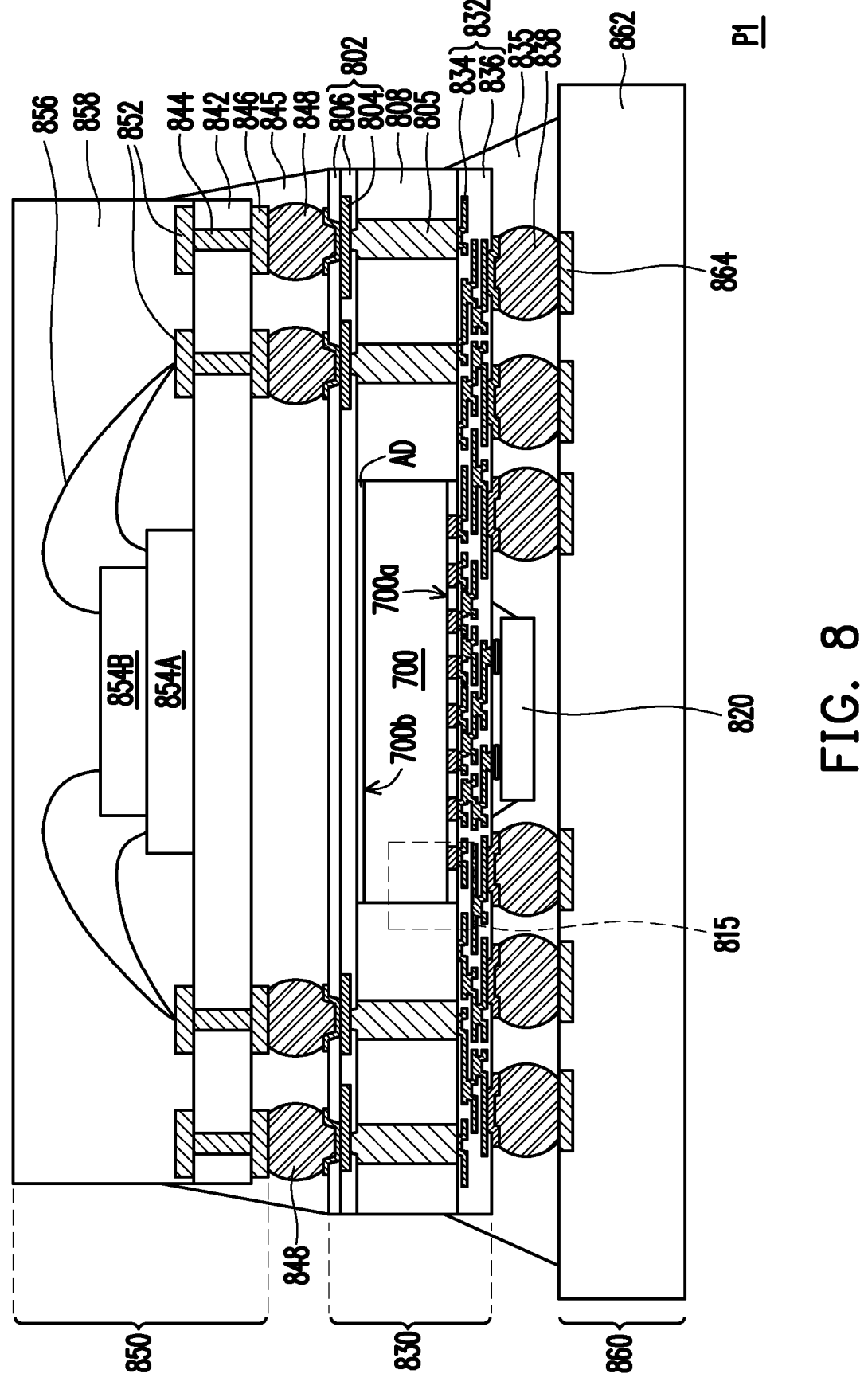
FIG. 8 is a cross-sectional view of a package structure in accordance with some embodiments.
Figure 9:
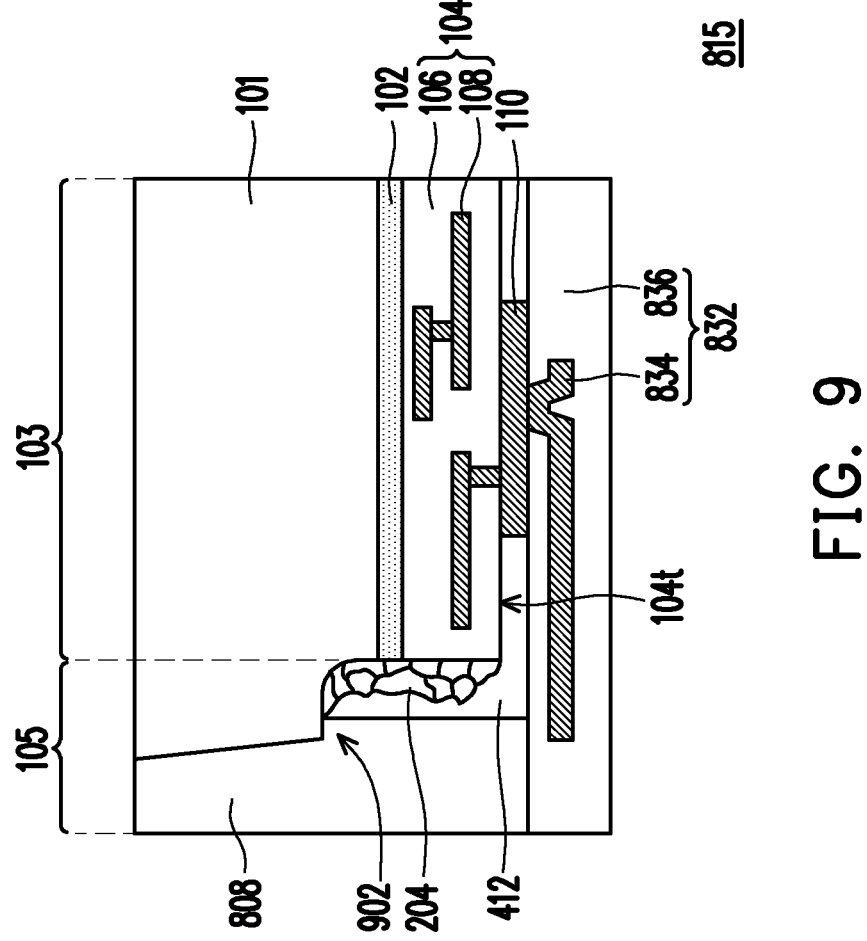
FIG. 9 is an enlarged views of a region of FIG. 8.

FIG. 8 is a cross-sectional view of a package structure in accordance with some embodiments. FIG. 9 is an enlarged view of a region 815 of FIG. 8.

Referring to FIG. 8, a package structure P1 may include a first package component 830 and a second package component 850 stacked on a circuit substrate 860. Herein, the package structure P1 may be referred to as a package-on-package (PoP) structure. In some embodiments, the first package component 830 includes one of the die structures 700, a plurality of through insulator vias (TIVs) 805, an encapsulant 808, a first redistribution layer (RDL) structure 832, and a second RDL structure 802. The die structure 700 may be formed between the first RDL structure 832 and the second RDL structure 802. In some embodiments, the die structure 700 may be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, the die structure 700 includes a memory die such as high bandwidth memory (HBM) die. Although only one die structure 700 is illustrated in FIG. 8, the embodiments of the present invention are not limited thereto. In alternative embodiments, one or more die structures are sandwiched between the first RDL structure 832 and the second RDL structure 802.

In detail, the die structure 700 includes a front side (or an active surface) 700a and the backside 700b opposite to each other. The front side 700a of the die structure 700 faces down and toward the first RDL structure 832, while the backside 700b of the die structure 700 faces up and toward the second RDL structure 802. Herein, the first RDL structure 832 may be referred to as a front side RDL (FSRDL) structure, and the second RDL structure 802 may be referred to as a backside RDL (BSRDL) structure. The die structure 700 may be adhered on the second RDL structure 802 through an adhesive layer AD such as a die attach film (DAF), silver paste, or the like. In the case, the backside 700b of the die structure 700 is in contact with the adhesive layer AD, so that the adhesive layer AD is disposed between the die structure 700 and the RDL structure 802.

In some embodiments, the second RDL structure 802 may include a plurality of conductive features 804 embedded in a dielectric layer 806. The dielectric layer 806 may be a single layer or a multilayer structure, for example. In some embodiments, a material of the dielectric layer 806 includes an inorganic dielectric material, an organic dielectric material, or a combination thereof. The inorganic dielectric material is, for example, silicon oxide, silicon nitride, silicon oxynitride, or a combination thereof. The organic dielectric material may include polymer. The polymer includes a photosensitive material, a non-photosensitive material, or a combination thereof. In some embodiments, the photosensitive material includes polybenzoxazole (PBO), polyimide, benzocyclobutene (BCB), positive photoresist, negative photoresist, a combination thereof, and/or the like. The non-photosensitive material includes Ajinomoto buildup film (ABF). The dielectric layer 806 may be formed by chemical vapor deposition, spin coating, or lamination. In some embodiments, the conductive features 804 includes a plurality of traces and vias (not shown) stacked alternately. The conductive features 804 is formed by following steps including forming a seed layer (not shown) on the dielectric layer by a CVD process or a PVD process (e.g., sputtering), forming a photoresist pattern (not shown) with a plurality of openings on the seed layer, forming a conductive material (not shown) in the openings by a plating process, and removing the photoresist pattern and the seed layer covered by the photoresist pattern. In the case, the conductive features 804 may include the conductive material and underlying seed layer. In some embodiments, the conductive features 804 may be made of conductive materials with low resistivity, such as copper (Cu), aluminum (Al), Cu alloys, Al alloys, or other suitable materials.

The first RDL structure 832 may include a plurality of conductive features 834 embedded in a dielectric layer 836. In some embodiments, the conductive features 834 include a plurality of traces and vias (not shown) stacked alternately. The material and forming method of the conductive features 834 and the dielectric layer 836 are similar to the material and forming method of the conductive features 804 and the dielectric layer 806 illustrated in above embodiments. Thus, details thereof are omitted here.

As shown in FIG. 8, the die structure 700 may be laterally encapsulated by the encapsulant 808. In some embodiments, the encapsulant 808 includes a molding compound, a molding underfill, a resin (such as an epoxy resin), or a combination thereof, or the like. The said molding compound may include a plurality of silica filler materials in a polymer base material. The encapsulant 808 may be formed by a sequence of an over-molding process and a planarizing process such as chemical mechanical polishing (CMP) process.

In detail, as shown in FIG. 9, the interconnect structure 104 is disposed on the semiconductor substrate 101 in the die region 103. The debris layer 204 is disposed on the semiconductor substrate 101 in the scribe line region 105 and further overlays the sidewall of the interconnect structure 104 and the sidewall of the device layer 102. The stress buffer layer 412 may extend from the top surface 104*t* of the interconnect structure 104 to cover the surface of the debris layer 204. Herein, since the die structure 700 turns upside down and is bonded onto the first RDL structure 832, the top surface 104*t* of the interconnect structure 104 illustrated in FIG. 9 faces down. In some embodiments, a sidewall of the stress buffer layer 412 is laterally offset inward from a sidewall of the semiconductor substrate 101, so as to form a staircase 902. The encapsulant 808 may wrap the staircase 902, and laterally encapsulate the semiconductor substrate 101 and the stress buffer layer 412. It should be noted that, in the present embodiment, the encapsulant 808 is physically spaced from the debris layer 204 by the stress buffer layer 412. That is, the stress buffer layer 412 completely wraps the surface of the debris layer 204, so that the encapsulant 808 is not in contact with the debris layer 204. The encapsulant 808 may be in direct contact with the stress buffer layer 412. The stress buffer layer 412 may have the Young's modulus less than a Young's modulus of the encapsulant 808, which means the stress buffer layer 412 is softer or more elastic than the encapsulant 808. In such embodiment, the stress buffer layer 412 can absorb the stress caused by the molding swelling due to moisture absorption, so that the delamination of the dielectric layer 106 of the interconnect structure 104 is reduced, thereby improving the reliability and the yield of the package structure P1. On the other hand, if the encapsulant 808 is in direct contact with the debris layer 204, the stress caused by the molding swelling would be transmitted into the interconnect structure 104 through the debris layer 204, thereby resulting in the delamination issue of the dielectric layer 106.

Referring back to FIG. 8, the TIVs 805 may be formed aside the die structure 700 and laterally encapsulated by the encapsulant 808. In some embodiments, the TIVs 805 surround the die structure 700 in a plan view. The TIVs 805 may penetrate through the encapsulant 808 to contact the first RDL structure 832 and the second RDL structure 802. In this case, the TIVs 805 may be electrically connect the first RDL structure 832 and the second RDL structure 802. In some embodiments, the TIVs 805 are formed by photolithography, plating, and photoresist stripping process. For example, the TIVs 805 include copper posts. The TIVs 805 may be formed by following steps including forming a seed layer (not shown) on the second RDL structure 802 by a CVD process or a PVD process (e.g., sputtering), forming a photoresist pattern (not shown) with a plurality of openings on the seed layer, forming a conductive material (not shown) in the openings by a plating process, and removing the photoresist pattern and the seed layer covered by the photoresist pattern. In the case, the TIVs 805 may include the conductive material and underlying seed layer. In some alternative embodiments, the TIVs 805 are obtained by the manufacturer may be mounted on the second RDL structure 802. In some embodiments, the TIV 805 has a concave sidewall in a cross-sectional view. That is, an interface between the TIV 805 and the encapsulant 808 is curved in a cross-sectional view.

In some embodiments, the package structure P1 further includes a passive device 820. The passive device 820 may be disposed between the bottom surface of the first RDL structure 832 and the top surface of the circuit substrate 860. In some embodiments, the passive device 820 may be an integrated passive device (IPD), such as capacitors, resistors, inductors, baluns, couplers, splitters, filters, diplexers, or the like is able to be integrated in the IPD. The bottom surface of the passive device 820 and the top surface of the circuit substrate 860 are separated from each other by a non-zero distance. That is, the passive device 820 is bonded to the first RDL structure 832, while not bonded to the circuit substrate 860. Although only one passive device 820 is illustrated in FIG. 8, the embodiments of the present invention are not limited thereto. In alternative embodiments, one or more passive devices are bonded to the first RDL structure 832.

In some embodiments, the circuit substrate 860 may include a substrate core 862 and bond pads 864 over the substrate core 862. The substrate core 862 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 862 may be an SOI substrate. Generally, an SOI substrate includes a layer of a semiconductor material such as epitaxial silicon, germanium, silicon germanium, SOI, SGOI, or combinations thereof. The substrate core 862 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 862.

The substrate core 862 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 862 may also include metallization layers and vias (not shown), with the bond pads 864 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 862 is substantially free of active and passive devices.

In addition, the package structure P1 further includes a plurality of first conductive connectors 838. In some embodiments, the first conductive connectors 838 are reflowed to attach the first package component 830 to the bond pads 864. The first conductive connectors 838 electrically and/or physically couple the circuit substrate 860, including metallization layers in the substrate core 862, to the first package component 830. In some embodiments, a solder resist (not shown) is formed on the substrate core 862. The first conductive connectors 838 may be disposed in openings in the solder resist to be electrically and mechanically coupled to the bond pads 864. The solder resist may be used to protect areas of the substrate core 862 from external damage. Further, an underfill layer 835 is formed to laterally encapsulate the first conductive connectors 838, and the passive device 820. In some embodiments, the underfill layer 835 may be any acceptable material, such as a polymer, epoxy, molding underfill, or the like. The underfill layer 835 may have a curved sidewall.

As shown in FIG. 8, the second package component 850 may bonded onto the first package component 830 by a plurality of second conductive connectors 848. The second package component 850 may include, for example, a substrate 842 and one or more stacked dies 854A and 854B coupled to the substrate 842. Although one set of stacked dies 854A and 854B is illustrated, in other embodiments, a plurality of sets of stacked dies may be disposed side-by-side coupled to a same surface of the substrate 842. The substrate 842 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 842 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 842 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate 842.

The substrate 842 may include active and passive devices (not shown). A wide variety of devices such as transistors, capacitors, resistors, combinations of these, and the like may be used to generate the structural and functional requirements of the design for the second package components 850. The devices may be formed using any suitable methods.

The substrate 842 may also include metallization layers (not shown) and the conductive vias 844. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate 842 is substantially free of active and passive devices.

The substrate 842 may have bond pads 852 on a first side of the substrate 842 to couple to the stacked dies 854A, 854B, and bond pads 846 on a second side of the substrate 842, the second side being opposite the first side of the substrate 842, to couple to the conductive connectors 852. In some embodiments, the bond pads 852 and 846 are formed by forming recesses (not shown) into dielectric layers (not shown) on the first and second sides of the substrate 842.

The recesses may be formed to allow the bond pads 852 and 846 to be embedded into the dielectric layers. In other embodiments, the recesses are omitted as the bond pads 852 and 846 may be formed on the dielectric layer. In some embodiments, the bond pads 852 and 846 include a thin seed layer (not shown) made of copper, titanium, nickel, gold, palladium, the like, or a combination thereof. The conductive material of the bond pads 852 and 846 may be deposited over the thin seed layer. The conductive material may be formed by an electro-chemical plating process, an electroless plating process, CVD, atomic layer deposition (ALD), PVD, the like, or a combination thereof. In an embodiment, the conductive material of the bond pads 852 and 846 is copper, tungsten, aluminum, silver, gold, the like, or a combination thereof.

In some embodiments, the bond pads 852 and the bond pads 846 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 852 and 846. Any suitable materials or layers of material that may be used for the bond pads 852 and 846 are fully intended to be included within the scope of the current application. In some embodiments, the conductive vias 844 extend through the substrate 842 and couple at least one of the bond pads 852 to at least one of the bond pads 846.

In the illustrated embodiment, the stacked dies 854A and 854B are coupled to the substrate 842 by wire bonds 856 although other connections may be used, such as conductive bumps. In an embodiment, the stacked dies 854A and 854B are stacked memory dies. For example, the stacked dies 854A and 854B may be memory dies such as low-power (LP) double data rate (DDR) memory modules, such as LPDDR1, LPDDR2, LPDDR3, LPDDR4, or the like memory modules.

The stacked dies 854A and 854B and the wire bonds 856 may be encapsulated by a molding material 858. The molding material 858 may be molded on the stacked dies 854A, 854B and the wire bonds 856, for example, using compression molding. In some embodiments, the molding material 858 is a molding compound, a polymer, an epoxy, silicon oxide filler material, the like, or a combination thereof. A curing process may be performed to cure the molding material 858; the curing process may be a thermal curing, a UV curing, the like, or a combination thereof.

In some embodiments, the stacked dies 854A, 854B and the wire bonds 856 are buried in the molding material 858, and after the curing of the molding material 858, a planarization step, such as a grinding, is performed to remove excess portions of the molding material 858 and provide a substantially planar surface for the second package components 850.

After the second package components 850 are formed, the second package components 850 are mechanically and electrically bonded to the first package component 830 by the second conductive connectors 848. In some embodiments, the stacked dies 854A and 854B may be coupled to the die 100 through the wire bonds 856, the bond pads 852 and 846, the conductive vias 844, the second conductive connectors 848, the second RDL structure 802, the TIVs 805, and the first RDL structure 832. Further, an underfill layer 845 is formed to laterally encapsulate the second conductive connectors 848 and the second package components 850, thereby reducing stress and protecting the joints resulting from the reflowing of the second conductive connectors 848. In some embodiments, the underfill layer 845 may be any acceptable material, such as a polymer, epoxy, molding underfill, or the like. The underfill layer 845 may have a curved sidewall. In some embodiments, an area within an outermost perimeter of the first package component 830 is greater than an outermost perimeter of the second package components 850 in a plan view.

Moreover, although the said embodiment uses the PoP structure as an example to illustrate the packaging structure with the die structure 700, the embodiments of the present invention are not limited thereto. In other embodiments, the die structure 700 may be applied to any suitable package structure, such as chip on wafer on substrate (CoWoS) package structure, integrated fan-out (InFO) package structure, system on integrated chip (SoIC) package structure, or the like.

According to some embodiments, a method of forming a package structure including: forming an interconnect structure on a substrate; performing a laser grooving process to form a first opening in the interconnect structure and form a debris layer on a sidewall of the first opening in a same step; forming a protective layer to fill in the first opening and cover the debris layer and the interconnect structure; patterning the protective layer to form a second opening, wherein the second opening is spaced from the debris layer by the protective layer; performing a planarization process on the protective layer to expose a topmost contact pad of the interconnect structure; and performing a mechanical dicing process through the second opening to form a third opening in the substrate and cut the substrate into a plurality of semiconductor dies.

According to some embodiments, a package structure includes: at least one device die, comprising: a substrate, having a die region and a scribe line region; an interconnect structure, disposed on the substrate in the die region; a debris layer, disposed on the substrate in the scribe line region and overlying a sidewall of the interconnect structure; and a protective layer, extending from a top surface of the interconnect structure to cover a surface of the debris layer; and an encapsulant, laterally encapsulating the at least one device dies, wherein the encapsulant is physically spaced from the debris layer by the protective layer.

According to some embodiments, a method of forming a package structure includes: forming a first opening in a semiconductor wafer between a first semiconductor die and a second semiconductor die, and a debris layer is formed on a sidewall of the first opening simultaneously; forming a stress buffer layer to fill in the first opening and cover the debris layer; forming a second opening in the stress buffer layer within the first opening; cutting the semiconductor wafer to form a third opening, wherein the second opening is in spatial communication with the third opening to separate the first semiconductor die from the second semiconductor die; and forming an encapsulant to laterally encapsulate the first semiconductor die and/or the second semiconductor die, wherein the encapsulant is physically spaced from the debris layer by the stress buffer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a package structure, comprising:
   forming an interconnect structure on a substrate;
   performing a laser grooving process to form a first opening in the interconnect structure and form a debris layer on a sidewall of the first opening in a same step;
   forming a protective layer to fill in the first opening and cover the debris layer and the interconnect structure;
   patterning the protective layer to form a second opening, wherein the second opening is spaced from the debris layer by the protective layer;
   performing a planarization process on the protective layer to expose a topmost contact pad of the interconnect structure; and
   performing a mechanical dicing process through the second opening to form a third opening in the substrate and cut the substrate into a plurality of semiconductor dies.

2. The method of claim 1,
   wherein the substrate has a plurality of die regions and a scribe line region surrounding the plurality of die regions,
   wherein the first opening, the second opening, and the third opening are all located in the scribe line region.

3. The method of claim 1, wherein a width of the first opening is greater than a width of the second opening, and the width of the second opening is greater than a width of the third opening.

4. The method of claim 1, wherein before the forming the protective layer, the method further comprises performing a surface treatment to increase an adhesion between the protective layer and the interconnect structure.

5. The method of claim 1, wherein the patterning the protective layer comprises performing a photolithography process on the protective layer.

6. The method of claim 1, wherein the patterning the protective layer comprises performing a laser ablation process on the protective layer.

7. The method of claim 1, wherein the first opening penetrates through the interconnect structure and partially into the substrate.

8. The method of claim 1, wherein the third opening extends from a bottom surface of the second opening to a bottom surface of the substrate.

9. The method of claim 1, further comprising: forming an encapsulant to laterally encapsulate the plurality of semiconductor dies, wherein the encapsulant is physically spaced from the debris layer by the protective layer.

10. The method of claim 1, wherein after performing the planarization process, a top surface of the protective layer is level with a top surface of the topmost contact pad of the interconnect structure.

11. A method of forming a package structure, comprising:
    forming at least one device die, comprising:
    providing a substrate having a die region and a scribe line region;
    forming an interconnect structure on the substrate in the die region;
    forming a debris layer on the substrate in the scribe line region and overlying a sidewall of the interconnect structure; and
    forming a protective layer extending from a top surface of the interconnect structure to cover a surface of the debris layer; and forming an encapsulant to laterally encapsulate the at least one device die, wherein the encapsulant is physically spaced from the debris layer by the protective layer, and a Young's modulus of the protective layer is less than a Young's modulus of the encapsulant.

12. The method of claim 11, wherein a top surface of the substrate in the die region is higher than a top surface of the substrate in the scribe line region.

13. The method of claim 11, wherein the protective layer completely wraps the surface of the debris layer, so that the encapsulant is not in contact with the debris layer.

14. The method of claim 11, wherein a sidewall of the protective layer is laterally offset inward from a sidewall of the substrate.

15. The method of claim 11, wherein a top surface of the protective layer is level with a top surface of a topmost contact pad of the interconnect structure.

16. A method of forming a package structure, comprising:

forming a first opening in a semiconductor wafer between a first semiconductor die and a second semiconductor die, and a debris layer is formed on a sidewall of the first opening simultaneously;

forming a stress buffer layer to fill in the first opening and cover the debris layer;

forming a second opening in the stress buffer layer within the first opening;

cutting the semiconductor wafer to form a third opening, wherein the second opening is in spatial communication with the third opening to separate the first semiconductor die from the second semiconductor die; and forming an encapsulant to laterally encapsulate the first semiconductor die and/or the second semiconductor die, wherein the encapsulant is physically spaced from the debris layer by the stress buffer layer.

17. The method of claim 16, wherein the second opening is located on the third opening, and a width of the second opening is greater than a width of the third opening.

18. The method of claim 16, wherein the encapsulant is in direct contact with the stress buffer layer and not in direct contact with the debris layer.

19. The method of claim 16, wherein the forming the first opening comprises: performing a laser grooving process.

20. The method of claim 16, wherein a Young's modulus of the stress buffer layer is less than a Young's modulus of the encapsulant.

\* \* \* \* \*